United States Patent
Zach

(10) Patent No.: US 8,314,402 B2
(45) Date of Patent: Nov. 20, 2012

(54) CORRECTOR

(75) Inventor: Joachim Zach, Oestringen (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 79 days.

(21) Appl. No.: 12/929,769

(22) Filed: Feb. 15, 2011

(65) Prior Publication Data

US 2012/0193533 A1    Aug. 2, 2012

(30) Foreign Application Priority Data

Feb. 1, 2011 (DE) .......................... 10 2011 009 954

(51) Int. Cl.
*G21K 1/08* (2006.01)
(52) U.S. Cl. ............................... 250/396 R; 250/396 ML
(58) Field of Classification Search .................. None
See application file for complete search history.

(56) References Cited

U.S. PATENT DOCUMENTS

| | | | | |
|---|---|---|---|---|
| 4,962,313 | A * | 10/1990 | Rose | 250/311 |
| 5,021,670 | A * | 6/1991 | Lanio et al. | 250/396 R |
| 5,838,011 | A * | 11/1998 | Krijn et al. | 250/396 R |
| 6,329,659 | B1 * | 12/2001 | Krijn et al. | 250/396 R |
| 7,807,965 | B2 * | 10/2010 | Zach et al. | 250/311 |
| 7,989,776 | B2 * | 8/2011 | Muller et al. | 250/396 ML |
| 2002/0158736 | A1 * | 10/2002 | Gottschalk | 335/306 |

(Continued)

FOREIGN PATENT DOCUMENTS

DE    42 04 512    8/1993

OTHER PUBLICATIONS

O. Scherzer, "Sphaerische and chromatische Korrektur von Elektronen-Linsen", Optik, DE, Jena, 1947, Pa. 114-132, XP002090897, ISSN: 0863-025900227US.

(Continued)

*Primary Examiner* — Robert Kim
*Assistant Examiner* — Andrew Smyth
(74) *Attorney, Agent, or Firm* — Paul Vincent

(57) ABSTRACT

The invention concerns a corrector (9) for chromatic and aperture aberration correction in an electron microscope with six multipoles (1, 2, 3, 4, 5, 6) which are disposed in the optical path (7) one after the other symmetrically with respect to a symmetry plane (8) for generating quadrupole fields (1', 2', 3', 4', 5', 6') and octupole fields, wherein the quadrupole fields (1', 2', 3', 4', 5', 6') of all six multipoles (1, 2, 3, 4, 5, 6) are consecutively rotated through 90° with respect to one another, thereby generating a mirror-symmetrical exchange symmetry of the axial fundamental rays ($x\alpha$, $y\beta$).
In accordance with the invention, the following is provided for correcting azimuthal coma:
A double multipole (10) with a multipole element (11) upstream of the symmetry plane (8) and a multipole element (12) downstream of the symmetry plane (8), which generates two octupole fields (11', 12') of the same orientation as the quadrupole fields (1', 2', 3', 4', 5', 6') and two further octupole fields (11", 12"), which have opposite poles and exert a force on the electrons in a direction rotated through 90° with respect to the above-mentioned octupole fields (11', 12') in the principal sections (x, y). The six multipoles (1, 2, 3, 4, 5, 6) generate octupole fields (1", 2", 3", 4", 5", 6") with the same orientation, and the adjustment of the poles and of the field strengths of the octupole fields (1", 2", 3", 4", 5", 6", 1", 12") is used for the above-mentioned correction.

15 Claims, 6 Drawing Sheets

U.S. PATENT DOCUMENTS

| | | | |
|---|---|---|---|
| 2003/0098415 A1* | 5/2003 | Matsuya et al. | 250/306 |
| 2003/0122076 A1* | 7/2003 | Matsuya et al. | 250/311 |
| 2003/0209676 A1* | 11/2003 | Loschner et al. | 250/492.2 |
| 2004/0004192 A1 | 1/2004 | Krivanek | |
| 2004/0036030 A1* | 2/2004 | Matsuya et al. | 250/396 R |
| 2004/0188635 A1* | 9/2004 | Kawasaki et al. | 250/492.3 |
| 2004/0227099 A1* | 11/2004 | Matsuya | 250/398 |
| 2005/0017194 A1* | 1/2005 | Matsuya et al. | 250/396 R |
| 2005/0029466 A1* | 2/2005 | Kawai et al. | 250/396 R |
| 2005/0156117 A1* | 7/2005 | Uno | 250/396 R |
| 2005/0189496 A1* | 9/2005 | Uno | 250/396 R |
| 2005/0247884 A1* | 11/2005 | Nakamura et al. | 250/396 R |
| 2006/0016991 A1* | 1/2006 | Kawasaki et al. | 250/310 |
| 2006/0219935 A1* | 10/2006 | Henstra | 250/396 ML |
| 2007/0114408 A1* | 5/2007 | Honda et al. | 250/310 |
| 2007/0114409 A1* | 5/2007 | Kawasaki et al. | 250/310 |
| 2007/0181806 A1* | 8/2007 | Nakano et al. | 250/310 |
| 2007/0278416 A1* | 12/2007 | Kawai | 250/396 ML |
| 2009/0008551 A1* | 1/2009 | Kawasaki et al. | 250/311 |
| 2009/0039281 A1* | 2/2009 | Kawasaki et al. | 250/396 R |
| 2009/0101818 A1* | 4/2009 | Zach | 250/311 |
| 2009/0146056 A1* | 6/2009 | Zach et al. | 250/311 |
| 2010/0072387 A1* | 3/2010 | Sawada et al. | 250/396 ML |
| 2012/0153147 A1* | 6/2012 | Zach et al. | 250/311 |

OTHER PUBLICATIONS

Keiji Tamura et al., "Third-order spherical aberration correction using multistage self-aligned quadrupole correction-lens systems", Journal of Electron Microscopy 59(3): 197-206 (2010).

* cited by examiner

CORRECTOR](#)

BACKGROUND OF THE INVENTION

The invention concerns a corrector for chromatic and aperture aberration correction in an electron microscope with six multipoles which are disposed in the optical path, one after the other, and symmetrically with respect to a symmetry plane in such a fashion that the first three are disposed upstream of the symmetry plane and the second three are disposed downstream of the symmetry plane, and all of which are used for generating quadrupole fields and octupole fields, wherein the quadrupole fields of all six multipoles are consecutively rotated through 90° with respect to one another and are point-symmetrical with respect to the point of intersection between the optical axis and the symmetry plane, wherein an exchange symmetry of the axial fundamental rays with the symmetry plane as mirror plane for the exchange is generated, and wherein both the axial and the off-axial fundamental rays are reunited at the end of the corrector, and chromatic aberration correction can be achieved through cooperation of the quadrupole fields, designed in the form of magnetic and electrical fields, of the third and fourth multipoles, and aperture aberration correction and off-axial aberrations, produced by the corrector itself, are corrected through adjustment of octupole fields which exert the same direction of force on the electrons in the principal sections as the quadrupole fields.

The purpose of a corrector of this type is that the chromatic and aperture aberrations of the optical components of the microscope can be compensated for. Compensation using such correctors not only compensates for aberrations of the beam source and the lenses of the electron microscope but also for aberrations caused by the corrector itself.

The basis of the function of all correctors in particle optics is the discovery by O. Scherzer (O. Scherzer: "Sphärische and chromatische Korrektur von Elektronen-Linsen" (spherical and chromatic correction of electron lenses) OPTIK, DE, JENA, 1947, pages 114-132, XP002090897, ISSN: 0863-0259) that chromatic and aperture aberrations can be corrected for particle beams by generating non-rotationally symmetrical fields using quadrupoles for forming a non-circular beam, which is then aberration-corrected and made round again by oppositely acting fields. The non-circular beam areas may be astigmatic intermediate images or an elliptical beam area. These are then used for aberration correction using multipole fields, such as hexapole fields, octupole fields or twelve-pole fields using multipoles. These fields are then exclusively used for performing corrections and have no influence on the fundamental ray behavior. Only chromatic aberration correction is performed with quadrupole fields, wherein one electric and one magnetic quadrupole cooperate in each of both the x and the y directions. O. Scherzer sets the conditions under which such aberration corrections can be achieved (loc.cit.). These conditions, which are called Scherzer theorem, form the basis of any chromatic and aperture aberration correction in particle optics.

DE 10 2007 049 816 B3 discloses a corrector which consists of five multipole elements but which itself causes a considerable amount of aberrations of higher order, which aggravates aberration compensation.

DE 42 04 512 A1 proposes a corrector of the above-mentioned type which causes less aberrations of higher order but does not eliminate azimuthal coma, which is a requirement for a corrector to be used in a transmission electron microscope. This corrector is moreover extremely sensitive to field fluctuations of the quadrupole fields. These field fluctuations, which are also called "noise", are caused by fluctuations in the current or voltage supply. The sensitivity to such fluctuations turned out to be sufficiently large in the test phase of a corrector constructed in accordance with this document, that it was impossible to handle this sensitivity with reasonable technical expense by means of highly stable supply of electric energy. For this reason, both the attempt of realizing this corrector as well as the subject patent application were abandoned.

It is therefore the underlying purpose of the invention to further develop a corrector of the above-mentioned type in such a fashion that it is suited for transmission electron microscopes and is insensitive to fluctuations in the electrical energy supply.

SUMMARY OF THE INVENTION

This object is achieved in accordance with the invention in that the corrector can be arranged in the optical path with the electron beam being convergently irradiated with respect to the optical axis in such a fashion that the axial fundamental rays only have maxima in the area of the third and fourth multipoles, and a double multipole is arranged between the two central multipoles, which has a first multipole element upstream of the symmetry plane and an adjoining second multipole element downstream of the symmetry plane, wherein these multipole elements generate a first and a second octupole field which exert a force on the electrons in the principal sections in the same direction as the quadrupole fields, wherein the first multipole element also generates a third octupole field and the second multipole element additionally generates a fourth octupole field which have differing polarities and which exert a force on the electrons in a direction which is rotated through 90° with respect to the optical axis in the principal sections and relative to the first and second octupole fields, the third and fourth multipoles generating octupole fields which are mirror-symmetrical with respect to the point of intersection between the optical axis and the symmetry plane, the octupole fields exerting a force on the electrons in the principal sections in a direction that corresponds to the first and the second octupole field of the double multi pole, but rotated through 45° relative thereto, wherein the six multipoles generate octupole fields which exert a force on the electrons in the principal sections, the force being rotated through 90° with respect to the optical axis in correspondence with the third and fourth octupole fields of the double multipole and being point-symmetrical, with respect the point of intersection between the optical axis and the symmetry plane, in field strength and sign, and the adjustment of poles and field strengths of the octupole fields which are rotated through 90° with respect to the direction of the force that acts on the electrons as mentioned above is used for correcting the azimuthal coma while substantially preventing the generation of other aberrations.

In the invention, the octupole fields which have the same orientation as the quadrupole fields are used for correcting aperture aberrations in the same fashion as in DE 42 04 512 A1. The same orientation of octupole fields with respect to the quadrupole fields means that they exert a force on the electrons in the principal sections in the same direction as the quadrupole fields.

In contrast thereto, the octupole fields which exert a force on the electrons in the principal sections in a direction rotated through 90° compared to the quadrupole fields, are used for correcting the azimuthal coma, thereby substantially preventing generation of other aberrations. This means that certain unavoidable aberrations accompanying coma correction impair the image quality to a much lesser extent than the eliminated coma. As mentioned above, the further developments of the invention, in turn, eliminate such aberrations and subsequently also eliminate coma caused again by these measures by means of the rotated octupole fields. These steps, which are performed several times in an iterative method, then reduce the aberrations to such an extent that one can finally talk of non-existing aberrations with respect to the image quality. Rotation through 90° of the direction of force means with respect to these octupole fields that they are rotated through 22.5° with respect to the quadrupole fields (and with respect to the octupole fields of the same orientation as these quadrupole fields). The 90° variation in direction of the force that acts on the electrons then results from 4×22.5°, i.e. 90°.

For correcting the azimuthal coma, the poles and field strengths of these octupole fields are varied in a target-oriented fashion, i.e. oriented towards reduction and finally elimination of the azimuthal coma. The conditions for this target can be determined through test series but also through simulation calculation. The respective poles and field strengths thereby depend on the respective electron microscopes. They must be determined or calculated for individual types and the individual devices must then also be respectively fine adjusted.

The inventive corrector is moreover considerably less sensitive to fluctuations in the electrical energy supply, which either considerably reduces the expense for a highly stable energy supply and/or prevents deterioration of the image quality caused by such fluctuations.

This sensitivity to fluctuations in the energy supply and therefore in the field strengths of the respective fields results from the path height of the fundamental rays in the respective quadrupoles, wherein the sensitivity increases with the square of the path height. The axial fundamental rays thereby play a particular role. In the inventive corrector, the convergently entering fundamental rays $x\alpha$ and $y\beta$ slightly decrease towards the second quadrupole after entry into the first quadrupole. In contrast thereto, the fundamental ray $y\beta$ of the corrector of DE 42 04 512 A1 has a maximum in the second quadrupole, which has a particularly strong effect since the sensitivity increases with the square of the path height. The same naturally applies to the fifth and sixth quadrupole due to point symmetry (also called antisymmetry) of the quadrupole fields. Such maxima are only required in the third or fourth quadrupole for successful correction with respect to chromatic and aperture aberration and reduction of combination aberrations. For this reason, the inventive corrector having only these maxima requires a highly stable electrical energy supply only for the third and fourth multipoles. This means that only at these locations quadrupole fields are required which are almost free from field strength fluctuations. All other multipoles do not require such precise energy supplies. There are no quadrupole fields of this strength and no fundamental ray maxima of this magnitude. This substantially reduces the expense for electrical energy supply. Conversely, the image quality and resolution capacity are not impaired by these electrical supply energy fluctuations.

In this fashion, the invention prevents impairment of the image due to energy supply fluctuations as does the corrector of DE 42 04 512 A1, and also prevents generation of aberrations of higher order as does the corrector of DE 10 2007 049 816 B3 and moreover eliminates combination aberrations of fifth order and azimuthal coma. Due to the latter, the corrector can be used for transmission electron microscopes.

All fields of the first, second, fifth and sixth multipoles and the octupole fields of the third and fourth multipole elements may thereby be magnetic or electric fields or a combination of both. The same applies for the octupole fields of the double multipole and for all twelve-pole fields. Only the quadrupole fields of the third and fourth multipole must be cooperating electric and magnetic fields.

The inventive corrector is initially based on the previously disclosed functions, i.e. that in accordance with the teachings of O. Scherzer (cit.loc) the quadrupole field of the first multipole impresses a deviation from the rotational symmetry onto the beam with respect to the axial and off-axial fundamental rays such that the beams extend with different divergences in two perpendicular principal sections, the x and the y sections. The subsequent quadrupole field of the second multipole, which is rotated through 90°, causes the axial fundamental rays to extend with even greater divergence while causing the off-axial fundamental rays to converge again. The third multipole which generates a stronger quadrupole field compared to the first two, experiences a maximum of one of the axial fundamental rays and the fourth multipole experiences a maximum of the other axial fundamental ray. In cooperation with one respective octupole field having the same orientation as the quadrupole fields, this constellation enables substantial reduction in combination aberrations of fifth order.

An exchange symmetry is formed with respect to the axial fundamental rays $x\alpha$ and $y\beta$ downstream of the symmetry plane between the third and the fourth multipole. Exchange symmetry in this sense means that there is an exchange of the beam behaviors of the x section and the y section. This exchange symmetry is a mirror symmetry. This means that downstream of the symmetry plane, the fundamental ray $y\beta$ extends mirror-symmetrically with respect to the fundamental ray $x\alpha$ upstream of the symmetry plane and vice versa.

With respect to the off-axial fundamental rays $x\gamma$ and $y\delta$, an exchange symmetry is approximated, however, in the form of point symmetry or antisymmetry.

For this reason, the above-described constellation also occurs in the fourth quadrupole field, i.e. there is a maximum of the other axial fundamental ray. The quadrupole field thereby has an opposite sign, i.e. is rotated through 90°. Correspondingly, that is where the maximum of the other axial fundamental ray is, however, rotated through 90° and therefore in an opposite orientation with respect to the optical axis in the conventional representation of both the x and y sections (FIG. 2). That is where the above-mentioned correction is performed in an area of the beam which is perpendicular to the above-mentioned area. This corresponds to the principle of Scherzer: the correction of particle beams through deformation of the beam in such a fashion that it successively travels in the area of two planes which are perpendicular to each other.

Due to the antisymmetrical or point-symmetrical design of the quadrupole fields in which the first and the sixth, the second and the fifth, and the third and the fourth each have the same magnitude but opposite direction, the beam that enters the corrector in the form of a round beam, leaves the corrector again in the form of a round beam.

Chromatic aberration correction is also performed through the above-mentioned deformation of the beam, wherein this correction is performed with respect to a section, e.g. the x section, with the third multipole, and with respect to the other section, e.g. the y section, with the fourth multipole. The function of chromatic aberration correction corresponds to the conventional Wien filter and is based on the fact that the quadrupole fields consist of superimposed electric and magnetic quadrupole fields. The field strengths are thereby designed in such a fashion that electrons of a defined speed, i.e. a defined energy and defined color in relation to light optics, pass the fields on their predetermined path. The electrons of differing energies leave the predetermined path, which compensates for the chromatic aberration of the round lenses of the microscope, in particular, of the objective lens. The combination of electric and magnetic quadrupole fields is therefore only required for this chromatic aberration correction. A more detailed description of this chromatic aberration correction is given in H. Rose "Geometrical Charged-Particle Optics" in "9.1.1 First-Order Wien Filter", pages 274 to 277.

With respect to aperture aberrations, correction is also performed in the third and fourth multipoles and in the double multipole in each case by means of the octupole fields thereof which have the same orientation as the quadrupole fields, i.e. with the same force acting on the electrons in the principal sections. The aperture aberrations are caused by the rotationally symmetrical lenses of the electron microscope, since these have a greater effect on beams that extend at a larger separation from the optical axis. The beams in the area of the intermediate images consequently do not form a common point of intersection with the optical axis. The non-round beam deformation influences the beams by means of the octupole fields in such a fashion that all beams intersect again in the image plane of intermediate images. When correction of the beams of each section is performed, one after the other, and the beams are then again reunited into a round beam, the aperture aberration correction is completed. It is thereby not only possible to correct aperture aberrations of upstream round lenses but also previously compensate for aberrations of downstream round lenses. In this case, an aperture aberration is imposed onto the optical path such that it is cancelled again by the aperture aberrations of the downstream round lenses, e.g. of the objective.

When these conventional corrections are performed, there is, however, the problem that the corrector itself, in turn, causes aberrations. These are mainly non-round aberrations, in particular, four-fold astigmatism of third order and star aberration of fifth order. The non-round aberrations form axial image aberration figures such as astigmatism, star aberration, rosette aberration and coma, which occur in different orders. An aperture aberration of fifth order furthermore remains as a round aberration, which, as described above, can be largely eliminated in the area of the two maxima of the axial fundamental rays in the third and fourth multipole.

The above-described setting of the optical path extending convergently with respect to the optical axis generates the maxima of the axial fundamental rays in the areas of the third and fourth multipoles in order to reduce combination aberrations of fifth order. Since this is, however, only a rough setting of the optical path, fine adjustment can be additionally performed for eliminating further aberrations.

Fine adjustment of this type prevents generation of non-round coma-like aberrations of third order. Fine adjustment of this type can instead also be performed in such a fashion that rosette aberrations of fifth order are eliminated. In a further alternative variant, round imaging aberrations of fifth order are optimized for the desired imaging mode by means of this fine adjustment.

"Optimized" is to be understood on the basis that it is not always desirable to completely eliminate round imaging aberrations of fifth order, since round imaging aberration of fifth order can be used to generate improved phase contrast. In this case, "to optimize" means that an imaging aberration of fifth order is not eliminated but set at such a magnitude that the desired phase contrast is obtained.

It is not possible to perform all above-mentioned corrections or the above-mentioned optimization at the same time through fine adjustment, and for this reason it depends on the precise circumstances of a desired imaging mode, i.e. which aberration is more disturbing and must therefore be eliminated or whether the generation of an improved phase contrast is to be preferred among the respective precise circumstances.

Another proposal consists in that the first, second, fifth and sixth multipoles also generate octupole fields oriented with respect to the optical axis in such a fashion that they correspond to the first and second octupole fields of the double multipole and therefore also have the same orientation or exert a force on the electrons in the principal sections in the same direction as the quadrupole fields. Non-round coma-like aberrations of third order can then be eliminated through adjustment of these octupole fields.

In order to additionally also compensate for all aberrations up to fifth order except for minor residual aberrations, it is proposed that the double multipole, the third and also the fourth multipole elements generate twelve-pole fields for performing these corrections through corresponding adjustment thereof.

In the following further developments of the invention, the still existing residual aberrations are eliminated as far as possible. These small residual aberrations are caused by the round lenses located outside of the corrector and are, in particular, a reduced but still disturbing aperture aberration of fifth order. There are also further residual aberrations in the form of a rosette aberration of fifth order and radial coma of third order.

Towards this end, it is proposed to allocate two transfer lenses designed in the form of round lenses to the corrector on the objective side. The fields thereof can be adjusted in such a fashion that round aberrations of higher order or radial coma of third order are eliminated. Also in this case, correction setting is alternatively selected such that the image quality is maximally improved for each specific imaging mode.

However, transfer lenses of this type providing the respective precise adjustments again cause aberrations. In particular, correction of the aperture aberration of third order and chromatic aberration correction are partially cancelled again. For this reason, readjustment of the third and fourth multipoles and of the double multipole is desirable. In this connection, the electric and magnetic quadrupole fields which are used for chromatic aberration, and also the octupole fields of the same orientation of the third and fourth multipole and the octupole fields of the same orientation of the double multipole must be readjusted. Recurring aperture aberrations of third order are eliminated again by means of the octupole fields.

Recurring coma is caused by readjustment of the octupole fields which are rotated through 90° with respect to the quadrupole fields with respect to the direction of the force that acts on the electrons in the principal sections.

Since insertion of the transfer lenses and any adjustment, such as the above-mentioned readjustment, changes the optical path again, recurring aberrations of higher order are suitably eliminated through readjustment of the twelve-pole fields of the third and fourth multipoles and of the twelve-pole field of the double multipole.

Readjustment of the third and fourth multipoles and of the double multipole again generates round aberrations of higher order, which consequently requires readjustment of the transfer lenses. Subsequent thereto, the quadrupole fields of the third and fourth multipoles are readjusted for chromatic aberration correction, the octupole fields of the third and fourth multipoles and of the double multipole of the same orientation as the quadrupole fields are readjusted for correcting aperture aberrations of third order, the octupole fields, which exert a force on the electrons which is turned through 90° with respect to that of the quadrupole fields, are readjusted, in order to perform correction of a recurred azimuthal coma, and finally, the twelve-pole fields are readjusted for eliminating recurring aberrations of fifth order.

Since, as stated above, any adjustment of the above-mentioned elements generates further aberrations, repetition of the above mentioned individual steps must be iteratively performed until all aberrations are reduced to a degree that can be tolerated for the desired imaging.

A corrector of the type in accordance with the invention can, in principle, be inserted into any electron microscope. It is, however, particularly suited for transmission electron microscopes, since this corrector ensures that relatively large image areas can be generated without or with only few aberrations. The inventive corrector thereby comprises the structural requirements such as the spatial structure, windings and material properties and the required adjustment ranges for current and/or voltage for generating and regulating the field strengths of the respective magnetic and/or electric fields for performing the above-described settings and adjustments or readjustments.

Characterization of fields of the corrector to such a degree that settings and adjustments or readjustments are possible, therefore means the following: the structural designs of electrodes and/or electromagnets and the loading capacity thereof with current or voltage must be of such a kind that the stated correction measures may be performed after installation of the corrector in an electron microscope. These settings, adjustments and readjustments are performed after installation and start-up of the respective electron microscope, since the precise settings depend both on the construction of the electron microscope and on the individual lens aberrations which also individually occur in electron microscopes of the same series, e.g. due to measuring inaccuracies and material inhomogeneities. During operation of an electron microscope, readjustments are required from time to time, since even the smallest impurities change the optical properties, which may require readjustment. The invention is realized in a corrector which offers these electron beam corrections. The substantiation of the structural design of the corrector and the current and/or voltage ranges which are exactly provided and are required for the settings and corrections depend on the type of construction of the respective electron microscope, in particular, on the respective beam voltages of the possible working areas and the precise design of the lens systems.

Since the stated properties of the inventive corrector are effective after installation in an electron microscope, the invention also concerns a transmission electron microscope which is provided with the corrector, in which the advantages of the corrector due to aberration reduction in relatively large image areas are particularly beneficial.

The invention is explained below with reference to schematic views and embodiments of the drawing.

DESCRIPTION OF THE PREFERRED EMBODIMENT

Figure 1:
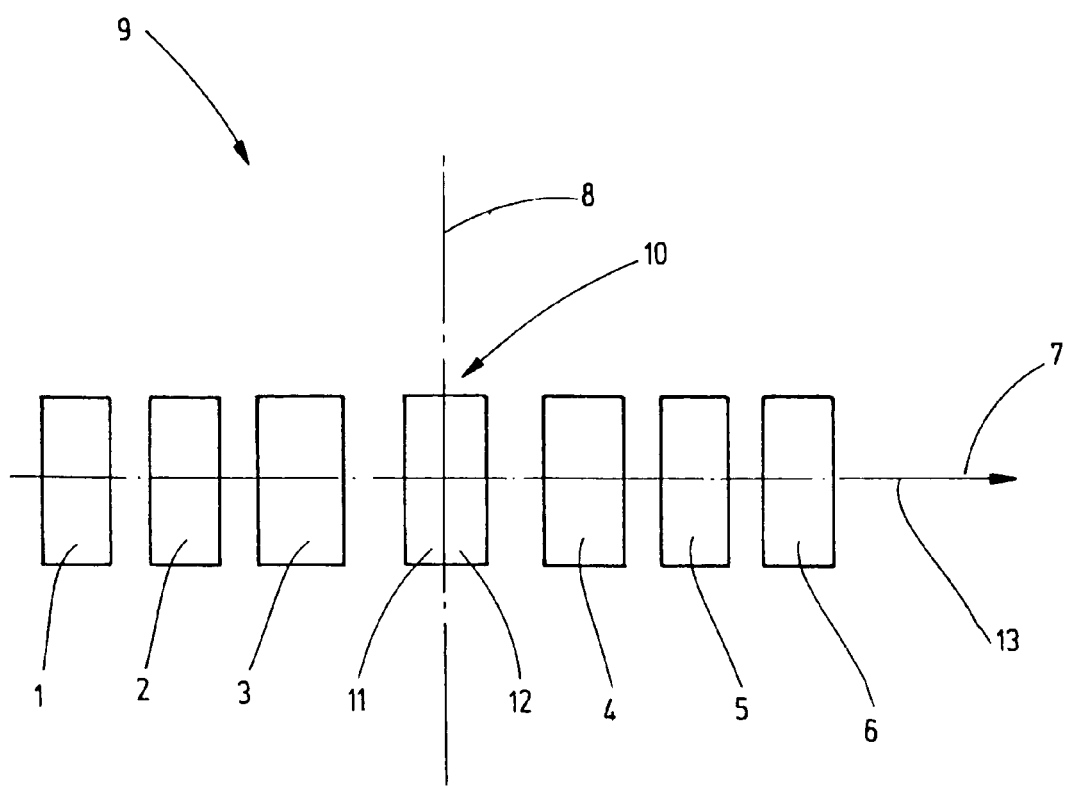
FIG. 1 shows a schematic view of the inventive corrector.

FIG. 1 shows a schematic view of the inventive corrector 9. A first 1, a second 2 and a third multipole 3 are arranged in the direction of the optical path 7 along the optical axis 13. Three further multipoles 4, 5, 6 follow downstream of a symmetry plane 8, wherein these are arranged symmetrically with respect to the multipoles 1, 2, and 3 and must also be identically symmetrically disposed with respect to the symmetry plane 8. The multipole 1 thereby corresponds to the multipole 6, the multipole 2 corresponds to the multipole 5 and the multipole 3 corresponds to the multipole 4.

A double multipole 10 is arranged in the symmetry plane 8 and has a first multipole element 11 upstream of the symmetry plane 8 and adjacent thereto a second multipole element 12 downstream of the symmetry plane 8.

Figure 2:
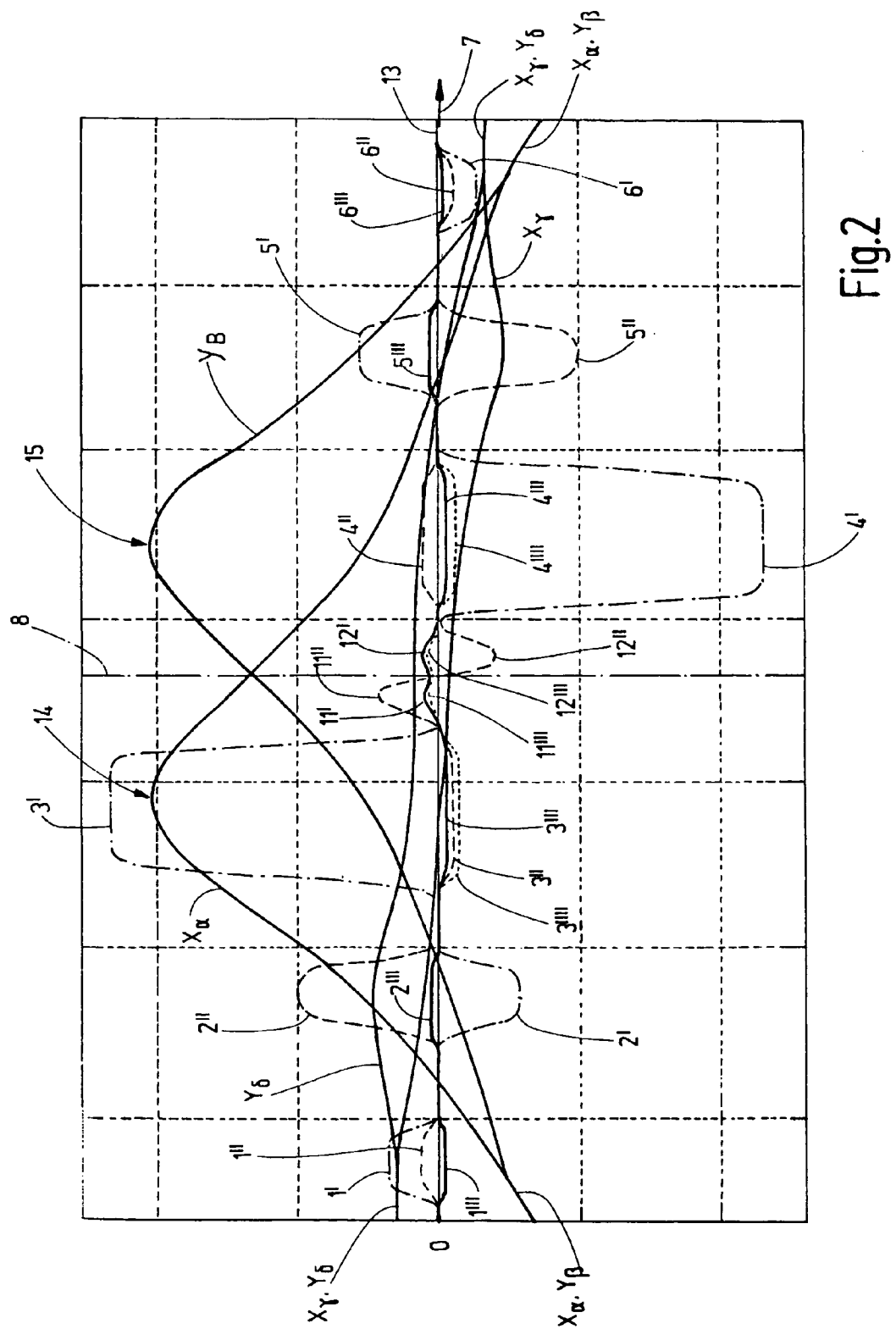
FIG. 2 shows the beam behavior in the planes x and y and the arrangement of the fields in correspondence with FIG. 1.

FIG. 2 shows the optical path of the corrector 9 comprising the fields which are required for the basic idea of the invention and also the fields for the further developments of the invention.

It shows two planes, which are perpendicular to each other, i.e. the x section and the y section with the optical paths of the axial fundamental rays xα and yβ and the off-axial fundamental rays xγ and xδ. The fundamental rays xα and xγ thereby extend in the x plane and the fundamental rays yβ and yδ extend in the y plane which is perpendicular to the x plane along the optical axis 13. FIG. 2 moreover shows the fields which are generated by the multipoles 1, 2, 3, 4, 5 and 6 and the double multipole 10. The optical path extends in the direction of the arrow 7 and the optical axis 13 extends through "0" of the vertical scale.

The first 1, the second 2, the fifth 5 and the sixth multipoles 6 are thereby designed to generate quadrupole fields 1', 2', 5' and 6', which may be electric or magnetic quadrupole fields 1', 2', 5', 6' or a combination of both. Towards this end, the multipoles 1, 2, 5 and 6 must have at least four electromagnets and/or four electrodes in an axially symmetrical arrangement with respect to the optical axis 13. In accordance with the further developments, they should also generate other fields, and are therefore suitably formed as conventional twelve-pole elements 22 (see FIGS. 5 and 6).

The third 3 and fourth multipoles 4 are generally also designed as twelve-pole elements 22 (see FIGS. 4 and 5), wherein they can generate electric and magnetic quadrupole fields 3', 4' in that e.g. the soft iron cores of the electromagnets are simultaneously used as electrodes. The third 3 and fourth multipoles 4 are thereby loaded with current for the electromagnets or with a potential for the electrodes in such a fashion that they generate superimposed magnetic and electric quadrupole fields 3', 4' which cooperate in such a fashion that the above-described chromatic aberration correction can be performed.

Figure 6A:
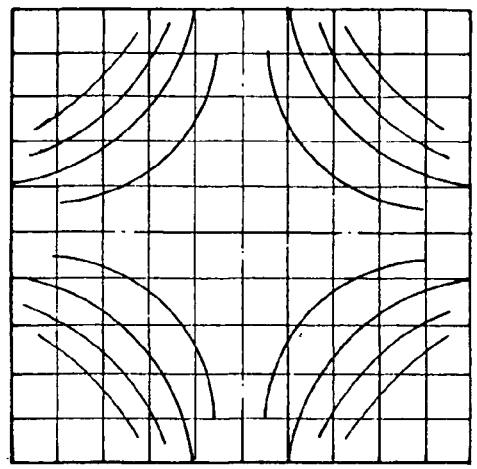
FIGS. 6a, 6b, 6c show potential distributions of different fields.
Figure 6B:
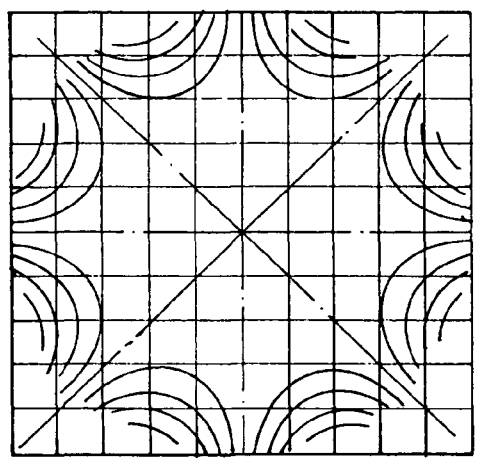
Figure 6C:
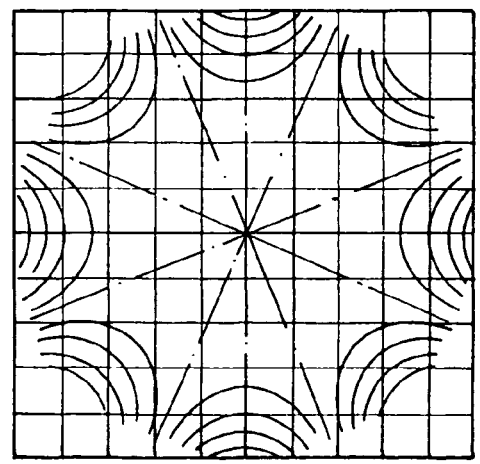

All six multipoles 1, 2, 3, 4, 5, 6 generate octupole fields 1'', 2'', 3'', 4'', 5'', 6'' in which the direction of the force acting on the electrons is rotated through 90° with respect to the above-mentioned quadrupole fields 1', 2', 3', 4', 5', 6' in the principal sections x, y (see in this connection FIGS. 6a and 6c).

All six multipoles 1, 2, 3, 4, 5, 6 moreover generate further octupole fields 1''', 2''', 3''', 4''', 5''', 6''' in which the force acts on the electrons in the same direction with respect to the quadrupole fields 1', 2', 3', 4', 5', 6' in the principal sections x, y (see FIGS. 6a and 6b).

Together with the neighboring multipole elements 11 and 12 between which the symmetry plane 8 is arranged, the double multipole 10 located between the multipoles 3 and 4 generates a first and a second octupole field 11' and 12' in which the force acts on the electrons in the same direction as in the quadrupole fields 1', 2', 3', 4', 5', 6'. The first multipole element 11 moreover generates a third octupole field 11" and the second multipole element 12 generates a fourth octupole field 12", which exert a force on the electrons in a direction rotated through 90° with respect to the optical axis 13 compared to the quadrupole fields 1', 2', 3', 4', and 5'. The third and fourth octupole fields 11" and 12" are thereby rotated through 45° with respect to each other and are therefore point-symmetrical with respect to the point of intersection between the optical axis 13 and the symmetry plane 8 in the drawing.

The third and the fourth multipoles 3 and 4 and the two multipole elements 11 and 12 of the double multipole 10 finally generate the twelve-pole fields 3"", 4"", 11"" and 12"", wherein the last-mentioned 11"" and 12"" are mirror-symmetrical with respect to the symmetry plane 8.

Convergent irradiation towards the optical axis 13 in such a fashion that the axial fundamental rays $x\alpha$, $y\beta$ have maxima 14 and 15 only in the areas of the third and fourth multipoles 3, 4, is of fundamental importance for the optical path generated by the quadrupole fields 1',2', 3', 4', 5', and 6' of the axial $x\alpha$, $y\beta$ and off-axial fundamental rays $x\gamma$, $x\delta$. The first quadrupole field 1' thereby causes deformation of the round beam with diverging axial $x\alpha$, $y\beta$ and off-axial fundamental rays $x\gamma$, $x\delta$. The second quadrupole field 2' causes a stronger increase in the axial fundamental rays $x\alpha$ and a drop in the off-axial fundamental rays $y\delta$. There is a maximum 14 of the axial fundamental ray $x\alpha$ in the third quadrupole field 3', which subsequently drops again, and a greater increase in the axial fundamental ray $y\beta$ such that it has a maximum 15 in the fourth quadrupole field 4'.

Downstream of the symmetry plane 8, the axial fundamental rays $x\alpha$ and $y\beta$ extend in a mirror-symmetrical fashion in a type of exchange symmetry between the fundamental rays $x\alpha$ and $y\beta$, wherein they intersect in the symmetry plane 8. The off-axial fundamental rays $x\gamma$, $x\delta$ approximately form an exchange in a point-symmetrical fashion around the point of intersection between the optical axis 13 and the symmetry plane 8. At the end of the corrector, the axial fundamental rays $x\alpha$ and $y\beta$ and the off-axial fundamental rays $x\gamma$ and $y\delta$ merge again and form again a round beam.

The corrector 9 initially yields the above-mentioned conventional chromatic aberration correction in that the quadrupole fields 3' and 4' are designed as cooperating magnetic and electric quadrupole fields 3', 4'.

Moreover, correction of aperture aberrations and off-axial aberrations caused by the corrector 9 itself, is performed in that octupole fields 3'", 4'" of the third and fourth multipoles 3, 4, which have the same orientation as the quadrupole fields 1', 2', 3', 4', 5', 6', perform this correction together with a central octupole field. The above-mentioned corrector of DE 42 04 512 A1 differs therefrom merely in that the central octupole field of the inventive corrector 9 is composed of the first two adjoining octupole fields 11' and 12' of the double multipole 10.

The inventive function of the correction of the azimuthal coma, which substantially prevents generation of other aberrations, is obtained by octupole fields 1", 2", 3", 4", 5", 6", 11", 12" which exert a force on the electrons in a direction which is rotated through 90° with respect to the quadrupole fields 1', 2', 3', 4', 5', 6' in the principal sections x, y. These are the octupole fields 1", 2", 3", 4", 5" and 6" of the multipoles 1, 2, 3, 4, 5 and 6, and the third and fourth octupole fields 11" and 12" of the multipole elements 11 and 12 of the double multipole 10.

With respect to the further developments of the invention, which enable further corrections through fine adjustment of the convergent irradiation of the electron beam $x\alpha$, $y\beta$, $x\gamma$ and $y\delta$ with respect to the optical axis 13, reference is made to the above explanations.

In a further development of the invention, the first, second, fifth and sixths multipoles 1, 2, 5, 6 also generate octupole fields 1'", 2'", 5'", 6'" which are oriented with respect to the optical axis 13 in such a fashion that they correspond to the quadrupole fields 1', 2', 3', 4', 5', 6' and therefore also to the first and second octupole fields 11', 12' of the double multipole with respect to the force acting on the electrons in the principal sections x, y. (The above-mentioned octupole fields 1", 2", 3", 4", 5", 6" are rotated through 22.5° with respect thereto (FIGS. 6b and 6c) which corresponds to the changed direction in which the force acts on the electrons in the principal sections x, y with rotation through 90° with respect to the optical axis 13). All these octupole fields 1'", 2'", 3'", 4'", 5'", 6'" and the first and second octupole fields 11' and 12' of the double multipole 10 are used to eliminate additional non-circular coma-like aberrations of third order.

In another suitable further development, twelve-pole fields 3'", 4'", 11'", 12'" of the third and fourth multipoles 3, 4 and of the double multipole 10 are used for correcting all axial aberrations up to fifth order.

With respect to all these corrections, it must be noted that each correction of an aberration, in turn, causes other aberrations, however, in a weakened form. For this reason, subsequent corrections are required. As previously mentioned, all correction steps must therefore be successively repeated several times in order to approach an aberration minimum of acceptable magnitude by means of the above-mentioned iterative method.

The sections x and y which extend perpendicular with respect to each other with the fundamental rays $x\alpha$ and $x\gamma$ in the x section and the fundamental rays $y\beta$ and $y\delta$ in the y section are naturally only used for illustrating the beam deformation which must be imagined as being 3-dimensional. For non-round fields, the case is analogous to cylinder lenses in light optics which also enable elimination of the produced distortion of an optical path by arranging counteracting cylinder lenses. The distortion is thereby used to correct chromatic aberrations and aperture aberrations and also further aberrations of an electron beam according to the Scherzer theorem.

Figure 3:
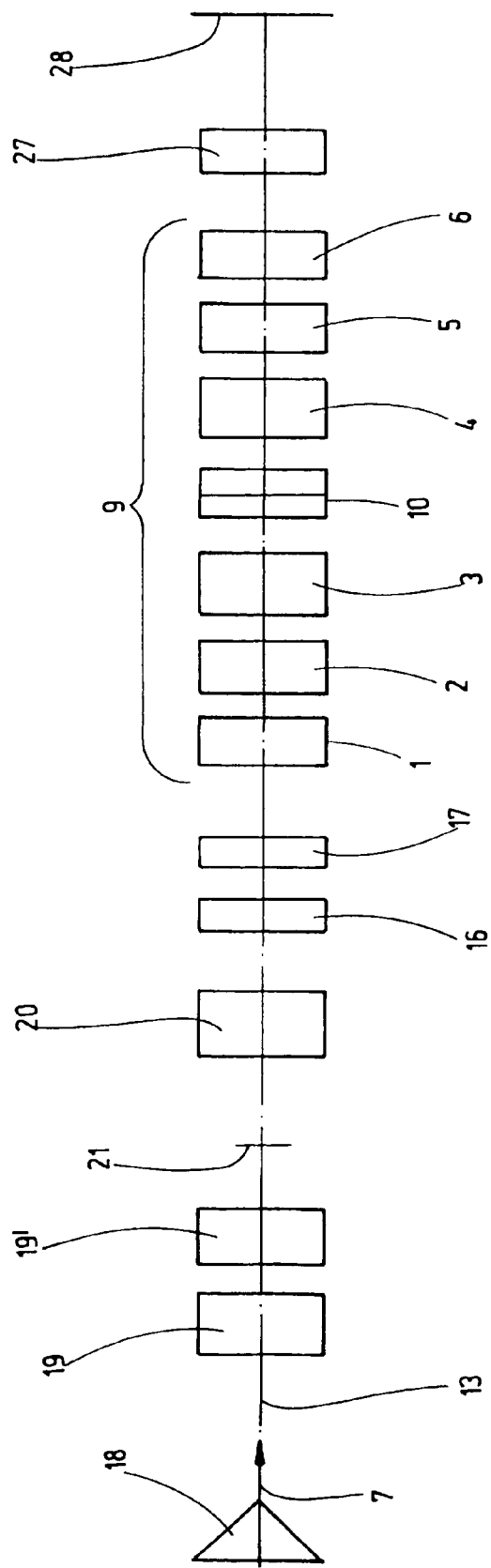
FIG. 3 shows a schematic partial view of a transmission electron microscope with a corrector.

FIG. 3 shows a schematic partial view of a transmission electron microscope. In the optical path 7, the condenser lenses 19, 19' are initially arranged downstream of the beam source 18 along the optical axis 13, followed by the object 21 and then by the objective 20. Downstream thereof are the transfer lenses 16 and 17 and the corrector 9. As described above, the correction quality can be further improved through adjustment of the transfer lenses 16 and 17 and iterative setting of the corrector 9 and the transfer lenses 16 and 17. The projective 27 and subsequent thereto, the image plane 28 are arranged downstream of the corrector 9.

Figure 4:
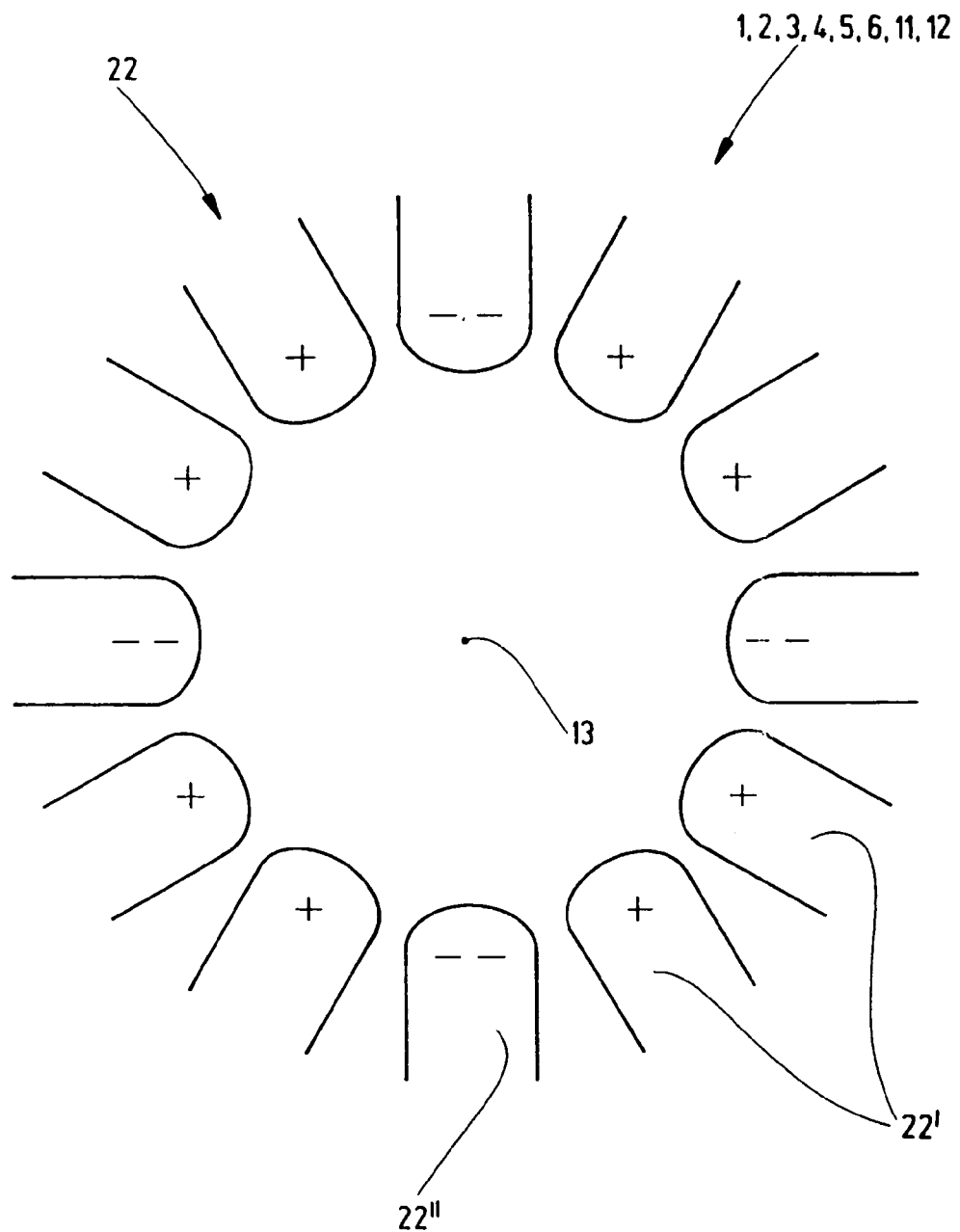
FIG. 4 shows a schematic view of a twelve-pole element that generates an octupole field.

FIG. 4 shows a schematic view of a multipole element that is designed as a twelve-pole element 22, wherein it may be one of the multipoles 1, 2, 3, 4, 5, 6 or one of the multipole elements 11, 12 of the double multipole 10. Twelve poles 22', 22" are disposed axially symmetrically around the optical axis 13.

When the twelve-pole element 22 is used to generate a twelve-pole field 3'", 4'", 11'", 12'", the poles 22', 22" are sequentially alternately formed as north and south poles for generating magnetic fields, or as negatively and positively charged electrodes for generating electric fields.

When a combination of an electric and magnetic field is to be generated, the soft iron cores of the electromagnets are simultaneously used as electrodes that are loaded with a voltage.

When a quadrupole field 1', 2', 3', 4', 5', or 6' is to be generated, three poles 22', 22" are combined in each case, i.e. magnets or electrodes, having the same polarity or charge, and the groups of three are alternately north and south poles or negatively and respectively positively charged electrodes. In this connection, electric and magnetic fields may also be superimposed. Such a superimposition can be used as cooperation like a Wien filter as described above in connection with chromatic aberration correction using the magnetic and electric fields 3', and 4'. Such cooperation may also be realized in the form of field enhancement.

In contrast thereto, when octupole fields are to be generated (as illustrated), the poles 22', 22" must alternate, as is indicated by the "+" and "−" signs. This means, two positively charged poles 22' and one negatively charged pole 22" are alternately arranged in series, wherein the negative charge (symbolized by the two "−" signs) must be correspondingly enhanced in order to obtain an octupole field that is preferably not distorted. The same applies correspondingly for generating a magnetic octupole. The above-mentioned alternating series may also be performed with reversed charges.

Superimposed fields such as quadrupole field, octupole field and twelve-pole field, generated by one single twelve-pole element 22 are obtained by summing up the currents or voltages at the respective poles 22', 22", i.e. in the electromagnets or electrodes. In this fashion, all above-mentioned field superimpositions can be generated.

Figure 5:
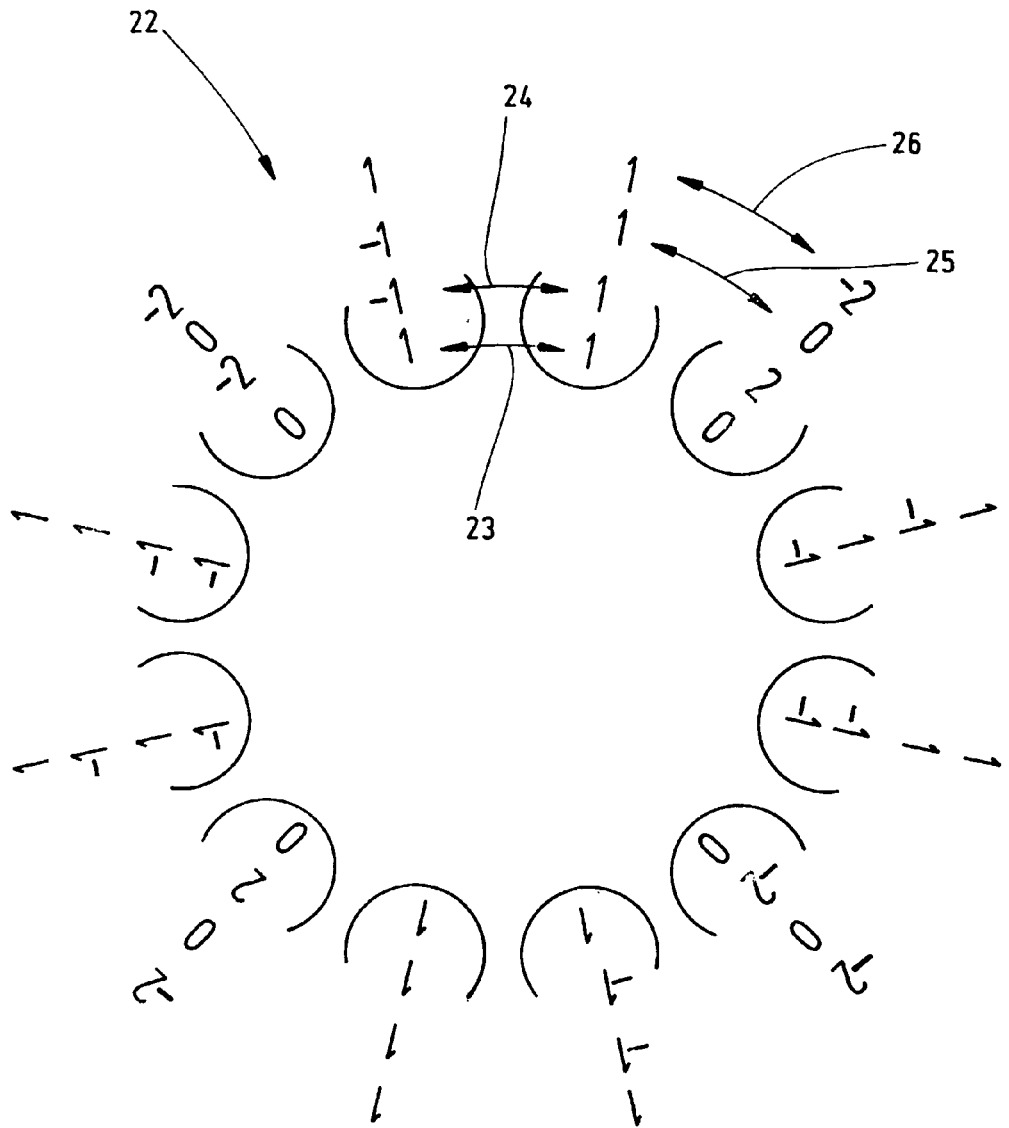
FIG. 5 shows a schematic view of a twelve-pole element showing generation of different fields.

FIG. 5 clearly and schematically shows the generation of different fields by a twelve-pole element 22.

Different pole assignments are thereby designated by numbers arranged in concentric circles, wherein the positive charges of electric poles or the south poles of the magnetic poles are without sign, the negative charges of electric poles or the north poles of magnetic poles are designated by "−" and when no pole is assigned designated by "0".

The innermost concentric circle shows the potential distribution 23 for an electric quadrupole and the subsequent concentric circle shows the potential distribution 24 for a magnetic quadrupole.

Both pole assignments 23 and 24 may also be designed as cooperating electromagnetic quadrupole.

The potential distribution 25 of the next concentric circle either specifies a magnetic octupole or an electric octupole which is rotated through 22.5°. This is due to the fact that, in electromagnets, the forces act perpendicularly with respect to the field, but in electrodes parallel to the field. For this reason, octupoles are mutually rotated through 22.5° with identical pole assignments.

The potential distribution 26 of the next concentric circle correspondingly either specifies the pole assignment of an electric octupole or a magnetic octupole that is rotated through 22.5° with respect to the latter.

When the pole assignments of the different potential distributions 23, 24, 25, or 26 are summed up, superimposed fields are generated.

FIGS. 6a, 6b and 6c show the potential distributions of different fields using the example of magnetic potential lines. FIG. 6a thereby shows the potential lines of a quadrupole field and FIG. 6b shows the potential lines of an octupole field of the same orientation. The same orientation means that the quadrupole field according to FIG. 6a exerts a force on the electrons in the principal sections in the same direction as the octupole field of FIG. 6b.

In contrast thereto, the octupole field of FIG. 6c is rotated through 22.5° with respect to the octupole field of FIG. 6b. This means that the direction in which the force acts on the electrons in the principal sections x, y of the octupole field of FIG. 6c is rotated through 90° compared to the octupole field of FIG. 6b.

LIST OF REFERENCE NUMERALS

1,2,3,4,5,6 multipoles
1',2',3',4',5',6' quadrupole fields of the multipoles 1,2,3,4,5 and 6 [dash-dotted lines]
1",2",3",4",5",6" octupole fields of the multipoles 1,2,3,4,5 and 6 (with a force acting on the electrons in a direction which is rotated through 90° with respect to the quadrupole fields in the principal sections x, y [dashed lines]
1'",2'",3'",4'", 5'",6'" octupole fields of the multipoles 1,2,3, 4,5,6 (with a force acting on the electrons in the same direction in the principal sections x, y as in the quadrupole fields) [solid lines]
3"",4"" twelve-pole fields of the multipoles 3,4 [dotted lines]
7 optical path
8 symmetry plane
9 corrector
10 double multipole
11,12 multipole elements of the double multipole 10
11' first octupole field of the double multipole (direction of the force acting on the electrons in the principal sections like quadrupole fields) [solid line]
12' second octupole field of the double multipole (direction of the force acting on the electrons in the principal sections like quadrupole fields) [solid lines]
11" third octupole field of the double multipole (force acting on the electrons in the principal sections in a direction rotated through 90° with respect to the quadrupoles [dashed line]
12" fourth octupole field of the double multipole (force acting on the electrons in the principal sections in a direction rotated through 90° compared to the quadrupoles [dashed line]
11'", 12'" twelve-pole fields of the double multipole [dotted lines]
13 optical axis
14 maximum of the axial fundamental ray xα
15 maximum of the axial fundamental ray yβ
16,17 transfer lenses
18 beam source
19,19' condenser lenses
20 objective
21 object
22 twelve-pole element
22' poles formed as electromagnet and/or electrode—south pole of the positively charged electrode
22" poles formed as electromagnet and/or electrode—north pole of the negatively charged electrode
23 potential distribution for an electric quadrupole
24 potential distribution for a magnetic quadrupole
25 potential distribution for a magnetic octupole or an electric octupole rotated through 22.5° with respect thereto
26 potential distribution for an electric octupole or a magnetic octupole rotated through 22.5° with respect thereto 27 projective
28 image plane
x,y sections
xα, yβ axial fundamental rays
xγ yδ off-axial fundamental rays

I claim:

1. A corrector for chromatic and aperture aberration correction in an electron microscope with multipoles which are disposed in an optical path along an optical axis, one after the other and symmetrically with respect to a symmetry plane, the corrector comprising:

a first multipole disposed upstream of the symmetry plane, said first multipole generating a first quadrupole field and a first octupole field;

a second multipole disposed downstream of said first multipole and upstream of the symmetry plane, said second multipole generating a second quadrupole field and a second octupole field;

a third multipole disposed downstream of said second multipole and upstream of the symmetry plane, said third multipole generating a third magnetic and electric quadrupole field, a third octupole field and a third additional octupole field;

a fourth multipole disposed downstream of said first multipole and downstream of the symmetry plane, said fourth multipole generating a fourth magnetic and electric quadrupole field, a fourth octupole field and a fourth additional octupole field;

a fifth multipole disposed downstream of said fourth multipole and downstream of the symmetry plane, said fifth multipole generating a fifth quadrupole field and a fifth octupole field;

a sixth multipole disposed downstream of said fifth multipole and downstream of the symmetry plane, said sixth multipole generating a sixth quadrupole field and a sixth octupole field, wherein said first, second, third, fourth, fifth and sixth quadrupole fields are consecutively rotated through 90° with respect to one another and are point-symmetrical with respect to a point of intersection between the optical axis and the symmetry plane, an exchange symmetry of axial fundamental rays being generated, with the symmetry plane being a mirror plane for the exchange symmetry, both axial and off-axial fundamental rays being reunited at an end of the corrector, with chromatic aberration thereby being corrected through cooperation of said third and said fourth magnetic and electric quadrupole fields, wherein aperture aberrations and off-axial aberrations produced by the corrector itself are corrected by adjustment of said third and said fourth additional octupole fields, said third and said fourth additional octupole fields thereby acting on electrons with a same direction of force as said first, second, third, fourth, fifth and sixth quadrupole fields in principal sections of the corrector; and a double multipole disposed between said third and said fourth multipoles, said double multipole having a first multipole element disposed upstream of the symmetry plane and an adjoining second multipole element disposed downstream of the symmetry plane, said first multipole element generating a first double multipole octupole field and said second multipole element generating a second double multipole octupole field, said first and second double multipole octupole fields exerting a force on electrons in said principal sections in a same direction as said first, second, third, fourth, fifth and sixth quadrupole fields, wherein said first multipole element additionally generates a third double multipole octupole field and said second multipole element additionally generates a fourth double multipole octupole field, said third and said fourth double multipole octupole fields having different polarities and exerting a force on electrons in a direction which is rotated through 90° with respect to the optical axis in said principal sections and relative to said first and second double multipole octupole fields, wherein said third and said fourth double multipole octupole fields are mirror-symmetrical with respect to the point of intersection between the optical axis and the symmetry plane and act on electrons in said principal sections with a force having a direction that corresponds to that of said first and second double multipole octupole fields, however rotated through 45° relative thereto, said first, second, third, fourth, fifth and sixth octupole fields thereby generating a force on electrons in said principal sections in a direction rotated through 90° with respect to the optical axis, in correspondence with said third and fourth double multipole octupole fields and which are point-symmetrical with respect to the point of intersection between the optical axis and the symmetry plane with regard to field strength and sign, wherein an adjustment of poles and field strengths of said first, second, third, fourth, fifth and sixth octupole fields is used for correcting an azimuthal coma while substantially preventing generation of other aberrations, the corrector thereby being arranged in the optical path in such a fashion that an electron beam is convergently irradiated with respect to the optical axis, with said axial fundamental rays only having maxima in regions of said third and said fourth multipoles.

2. The corrector of claim 1, wherein fine adjustment is performed with respect to convergent irradiation of the electron beam towards the optical axis such that any non-round, coma-like aberrations of third order are prevented.

3. The corrector of claim 1, wherein fine adjustment is performed with respect to convergent irradiation of the electron beam towards the optical axis in such a fashion that rosette aberrations of fifth order are eliminated.

4. The corrector of claim 1, wherein fine adjustment is performed with respect to convergent irradiation of the electron beam in such a fashion that round aperture aberrations of fifth order are optimized for a desired imaging mode.

5. The corrector of claim 3, wherein said first, second, fifth and sixth multipoles also generate respective first, second, fifth and sixth additional octupole fields having an orientation with respect to the optical axis such that they correspond to said first and second double multipole octupole fields with respect to the force that acts on the electrons in the principal sections to thereby eliminate non-round coma-like aberrations of third order.

6. The corrector of claim 4, wherein said first, second, fifth and sixth multipoles also generate respective first, second, fifth and sixth additional octupole fields having an orientation with respect to the optical axis such that they correspond to said first and second double multipole octupole fields with respect to the force that acts on the electrons in the principal sections to thereby eliminate non-round coma-like aberrations of third order.

7. The corrector of claim 1, wherein said double multipole and said third and fourth multipoles generate twelve-pole fields for correcting all axial aberrations up to fifth order.

8. The corrector of claim 1, further comprising two transfer lenses formed as round lenses and associated with the corrector on an objective side thereof.

9. The corrector of claim 8, wherein fields of said transfer lenses are structured to eliminated round aberrations of higher order.

10. The corrector of claim 8, wherein fields of said transfer lenses are structured to eliminate radial coma of third order.

11. The corrector of claim 8, wherein said third and fourth quadrupole fields, said third and fourth additional octupole fields and said first and second double multipole octupole fields are structured to generate a force acting on the electrons in said sections in a same direction as said first, second, third, fourth, fifth and sixth quadrupole fields to once more eliminate chromatic aberration of first order and aperture aberrations of third order caused by adjustment of said transfer lenses.

12. The corrector of claim 11, wherein readjustment of octupole fields which are rotated through 90° compared to said first, second third, fourth, fifth and sixth quadrupole fields with respect to a direction in which the force acts on the electrons in said principal sections is performed for eliminating recurring coma.

13. The corrector of claim 12, wherein readjustment of twelve-pole fields of said third and fourth multipoles and of said double multipole is possible for eliminating recurring aberrations of higher order caused by readjustment of said transfer lenses and by further readjustments.

14. The corrector of claim 13, wherein, for eliminating recurring chromatic aberrations of first order and aperture aberrations of third order and aberrations of higher order, quadrupole fields and octupole fields may be readjusted and octupole fields which are rotated through 90° with respect to a direction in which force acts on the electrons may be readjusted for correcting azimuthal coma, irradiation of the electron beam may be readjusted and twelve-pole fields may subsequently be readjusted for eliminating aberrations of fifth order, wherein iterative adjustment in above-mentioned steps may be performed for reducing aberrations caused, in turn, through respective previous readjustments until aberrations are reduced to a degree which can be tolerated for a desired imaging.

15. A transmission electron microscope having correction of an electron beam using the corrector of claim 1.

* * * * *